United States Patent [19]
Pavell et al.

[11] Patent Number: 6,063,436
[45] Date of Patent: May 16, 2000

[54] USE OF MULTIPLE MASKS TO CONTROL UNIFORMITY IN COATING DEPOSITION

[75] Inventors: James M. Pavell, Thousand Oaks; Chong C. Lee, Calabasas; Agop H. Cherbettchian, Santa Monica; Alan F. Stewart, Thousand Oaks, all of Calif.

[73] Assignee: Litton Systems, Inc., Woodland Hills, Calif.

[21] Appl. No.: 09/113,673

[22] Filed: Jul. 10, 1998

[51] Int. Cl.⁷ .............................. B05D 1/36; C23C 14/04; C23C 14/46
[52] U.S. Cl. .......................... 427/162; 427/282; 427/402; 427/526; 427/561; 204/192.11
[58] Field of Search ..................................... 427/526, 162, 427/282, 402, 421, 561, 595; 204/192.11

[56] References Cited

U.S. PATENT DOCUMENTS

| | | | |
|---|---|---|---|
| 4,142,958 | 3/1979 | Wei et al. | 204/192 P |
| 4,430,790 | 2/1984 | Ohta | 29/569 R |
| 4,793,908 | 12/1988 | Scott et al. | 204/192.26 |
| 5,156,727 | 10/1992 | Bjornard et al. | 204/298.11 |
| 5,776,359 | 7/1998 | Schultz et al. | 252/62.51 |

*Primary Examiner*—Shrive Beck
*Assistant Examiner*—Michael Barr
*Attorney, Agent, or Firm*—David J. Arthur

[57] ABSTRACT

The uniformity of individual layers of multiple coating materials deposited on a substrate in a vacuum deposition process (such as for manufacturing mirrors for use in ring laser gyroscopes) is improved by an apparatus and method that include changing the masks placed in front of the substrate upon which the coating materials are to be deposited. Separate masks are tuned for each particular coating material to compensate for the unique plume shape of the material, and provide a uniform deposition of that particular coating material. Each mask is positioned in front of the substrate when the material for which the mask has been tuned is being deposited. The masks are changed when the coating material is changed, without venting the chamber.

4 Claims, 6 Drawing Sheets

USE OF MULTIPLE MASKS TO CONTROL UNIFORMITY IN COATING DEPOSITION

BACKGROUND OF THE INVENTION

1. Field of the Invention

The present invention relates to processes for fabricating mirrors suitable for use in precision instruments such as ring laser gyroscopes. The present invention also relates to processes for depositing multiple coatings on a substrate, such as a mirror substrate. More particularly this invention pertains to a process for controlling the thickness of mirror layers deposited upon a mirror substrate within a deposition chamber.

2. Description of the Prior Art

A ring laser gyroscope is a rotation sensor that senses rotation about an axis that is perpendicular to the plane of a cavity formed within a frame, preferably of glass ceramic or other low thermal coefficient material. Highly polished mirrors are positioned at the corners of the cavities to direct the counterpropagating beams about the cavity. Beams of laser light circulate in opposite directions within the cavity. In accordance with the well-known Sagnac effect, the frequencies of the two beams are altered in opposite senses (i.e. one is increased while the other is decreased) by rotation about the axis and the beat frequency between the two beams then provides a measure of rotation. Lasing is affected within the cavity by the interaction of photons with an excited medium which acts as an amplifier. In a d.c. configuration, the medium is excited by the interaction of a fill gas, typically HeNe, with flows of electrical current between electrodes arranged about or within the gyro frame. Alternatively, in an r.f. actuated device, the medium is excited by means of an electromagnetic field that oscillated at radio frequencies. Only two counterrotating lasing modes need to be supported within the lasing cavity to obtain a measure of rotation. In a planar cavity, the counterrotating beams are linearly polarixed whereas a nonplanar cavity can support both right and left circularly-polarized modes.

As mentioned above, mirrors are provided at the corners of the cavity for directing the beams of light. In the case of a multioscillator or other multiple-cavity device the number of mirrors will correspondingly increase. The precision and, for that matter, operability of a ring laser gyroscope is critically dependent upon the quality of the mirrors. Surface defects and unevenness can produce a multitude of device infirmities.

The fabrication of high quality high reflectance mirrors for use in precision instruments such as ring laser gyroscopes involves the careful deposition of multiple layers of various material composition. Multiple layers are required to provide the high reflectivity that is necessary to generate the feedback required for ring laser gyro operation. Without the necessary high reflectivity, the gyro may be unable to assume operation as a low gain oscillator. That is, successful gyro operation requires that gyro gain exceed losses for the desired oscillation to occur.

The need to deposit multiple layers of material multiplies the possible sources of mirror surface nonuniformity. The presence of nonuniform mirror layers may result in the creation of a color band across the mirror aperture reflecting a spatial distribution of frequency response that does not permit laser gyro operation.

The coating layers of a precision mirror are created through a variety of deposition processes. Such processes are conventionally performed within a coating chamber that essentially comprises a sealable vacuum box. Among the processes for depositing materials in such an environment are thermal evaporation, electron beam, ion beam, and magnetron sputtering. FIG. 1 is a schematic view of the application of a mirror layer by one of such deposition processes within a coating chamber. Within the chamber, mirror substrates 10 are mounted upon a generally-planar rotatable tool 12 for receiving deposited material 14 produced by a material source (not shown). The physics of each of the above-named processes is characterized by the generation of an inherently-nonuniform spatial distribution of coating material known as a "plume".

The inherently non-uniform shape of the plume generated by the material source complicates the task of depositing mirror layers of uniform thickness. Even with rotation of the tool 12, each layer will have different thicknesses at different locations along the radius of the tool 12.

In accordance with the prior art, a shadow mask is placed between the material source and the tool 12. The more complete schematic view of a chamber deposition process illustrated by FIG. 2 shows such a shadow mask 16 in front of the tool 12. The mask is typically formed of thick (⅛–¼ inch) aluminum or other durable, solid material. The shadow mask 16 is shaped to even out the distribution of material that reaches the tool 12. The shape of the shadow mask 16 is successively trimmed until the desired uniformity of layer deposition in the presence of the plume-like emission of material is observed. Those skilled in the art will recognize that the mask shape is determined empirically. The most appropriate shape will depend on many factors, including the material being deposited, the configuration of the vacuum deposition chamber, and others.

It is well known by those skilled in the art that multiple fixed masks may be used to produce uniformity over surfaces with complex shapes. Several masks may be placed in various positions within the vacuum deposition chamber during a single deposition process to provide the appropriate mask shape to compensate for both a particular deposition material plume shape, and the complex shape of the surface being coated.

The mask 16 is held rigidly in a fixed position within the coating chamber throughout the deposition process.

SUMMARY OF THE INVENTION

The present invention is a method and apparatus for applying multiple coating layers to a substrate, such as the substrate for a mirror to be used in a ring laser gyroscope.

The method of the present invention includes placing in a vacuum chamber the substrate upon which first and second coating materials are to be applied, which vacuum chamber also contains a source of the first coating material and of the second coating material. A mask is placed between the substrate and coating material source. A flow of the first coating material is directed from the coating material source toward the mask and the substrate. After deposition of the first coating material, the mask is changed, and a flow of the second coating material is directed from the material source toward the substrate.

The apparatus of the present invention includes a vacuum chamber. A tool for receiving one or more substrates on which first and second coating materials are to be deposited is included in the interior of the vacuum chamber. Also in the interior of the vacuum chamber is a material source for sequentially generating within the chamber, and directing toward the tool, a first spatially distributed flux of the first coating material, and a second spatially distributed flux of the second coating material. A first mask having a first predetermined shape is included inside the chamber, and may be positioned between the material source and the tool when the material source is generating the first spatially distributed flux of the first coating material. A second mask having a second predetermined shape is also included, and may be positioned between the material source and tool when the material source is generating the second spatially distributed flux of the second coating material. The apparatus additionally includes a changer connected to the first and second masks, for selectively positioning the first and second masks between the material source and tool.

DETAILED DESCRIPTION OF A PREFERRED EMBODIMENT

Figure 3:
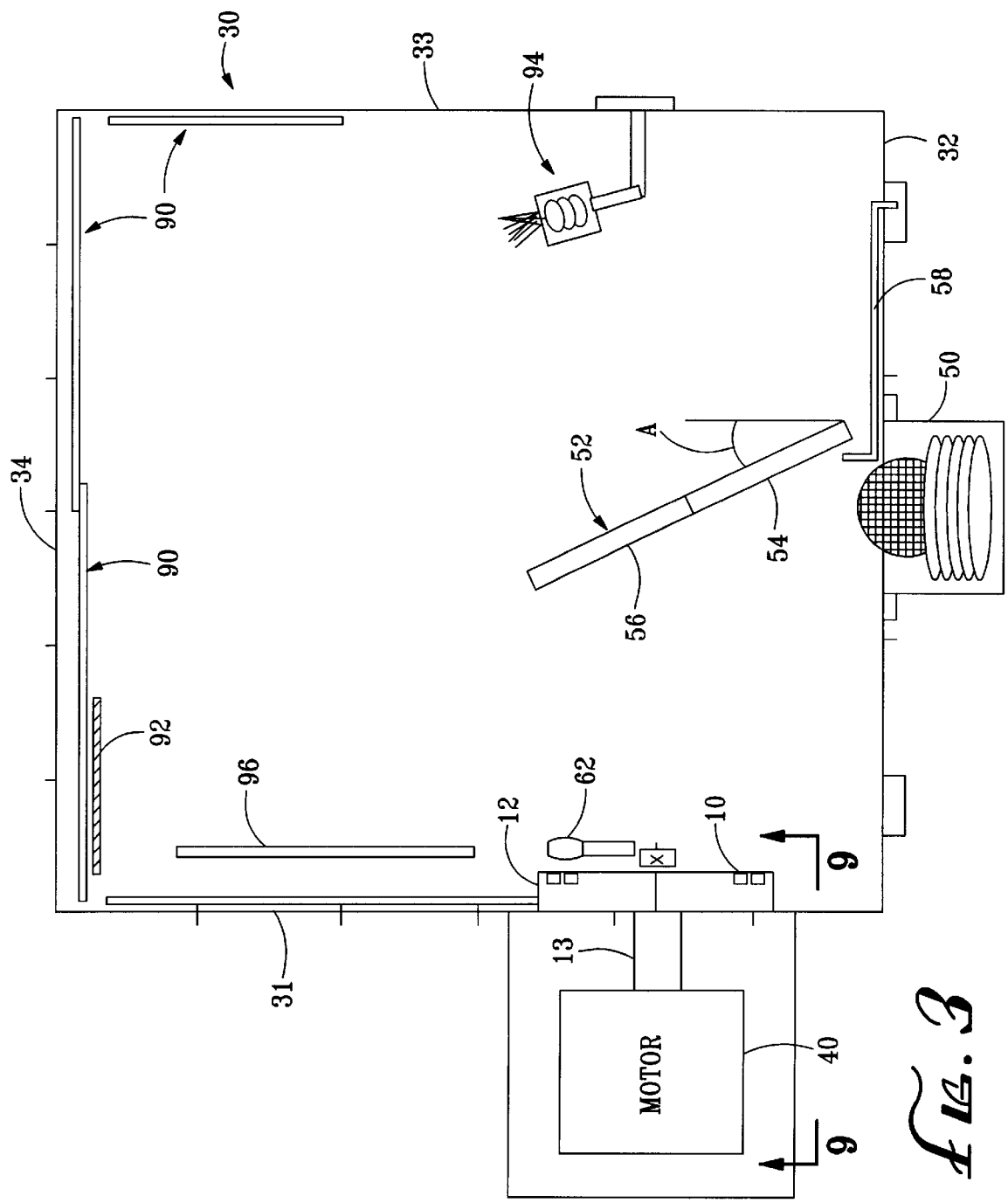
FIG. 3 is a schematic top view of a vacuum deposition chamber incorporating the present invention.

FIG. 3 is a schematic illustration of a vacuum deposition chamber 30 incorporating the present invention. The view of FIG. 3 is taken through the top of the chamber 30. The vacuum deposition chamber has a sealable volume formed by side walls 31, 32, 33, 34. Top and bottom walls (not shown) close off the chamber. The tool 12 holding the substrates to be coated may be mounted along a first side wall 31 of the chamber. As will be understood by those familiar with the art, a portion of the wall 31 holding the tool 12 may be openable to provide access between the chamber and the outside environment. As will also be apparent to those familiar with the art, the chamber 30 may have other shapes, and the elements contained within the chamber may have other orientations.

As noted previously, the tool 12 may be mounted on a rotating shaft 13. The shaft may be rotated by a motor 40 attached to the shaft. The motor 40 rotates the shaft 13 at a constant rate during the deposition process. By continuously rotating the shaft (and thus the tool 12), individual substrates 10 that are the same distance from the center of the tool 12 receive the same amount of deposited coating material. The motor 40 rotates the tool at a constant rate between 20–125 rpm.

A beam generator 50 is positioned on a second wall 32 of the chamber. In the particular embodiment described, the beam generator is an ion beam generator. The ion beam generator 50 may be a 12 cm RF gun. The ion beam generator 50 is oriented to direct its ion beam toward a material source 52 that contains first and second targets 54, 56. The first target 54 is formed of a first target material, and the second target 56 is formed of a second target material. The first target 54 may be formed of alumina. The second target 56 may be formed of another type of metal.

The material source 52 is oriented so that the surfaces of the targets 54, 56 are at an angle A relative to the beam from the ion beam gun 50.

The material source 52 is movable with respect to the ion beam gun 50 so that the first target 54 and the second target 56 may be selectively and separately positioned in the path of the ion beam produced by the ion beam gun 50.

Although this embodiment of the invention is described in conjunction with a vacuum coating chamber having an ion gun directed to target material that emits a plume like spatial distribution of coating material, those skilled in the art will recognize that the present invention is equally appropriate with other coating processes characterized by a spatially distributed output of coating material for impinging upon the surface of a substrate.

Figure 1:
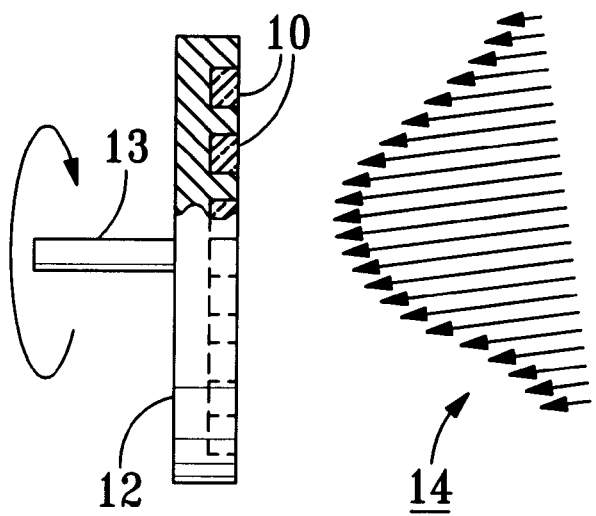
FIG. 1 is a schematic view of the basic elements of a coating deposition process.
Figure 2:
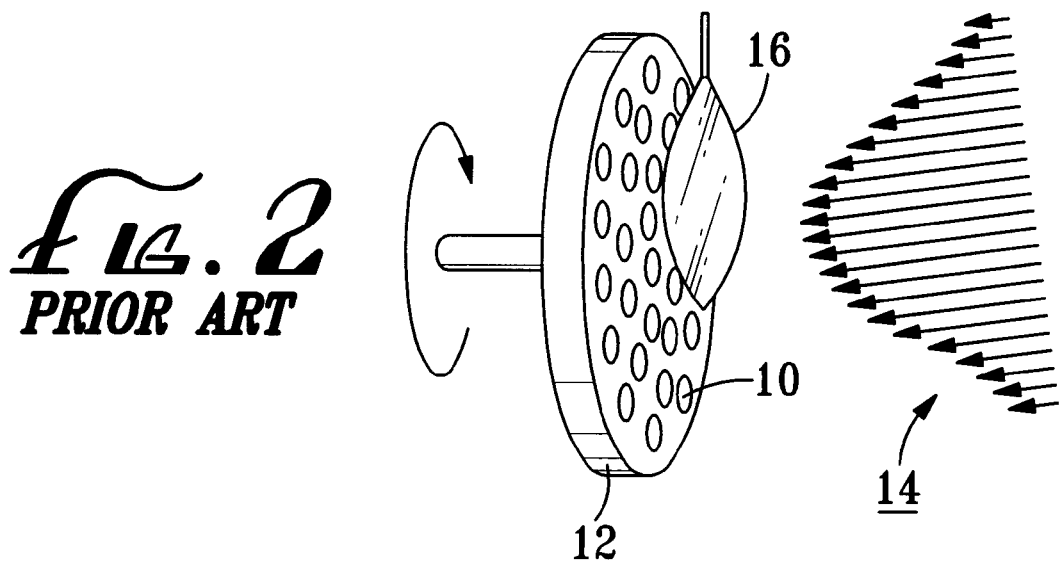
FIG. 2 is a second schematic view of a coating deposition process with a shadow mask included for counteracting the spatial distribution of the coating material.

An oxygen conduit 58 delivers oxygen gas to a point near the material source 52. As those skilled in the art will understand, when the ion beam strikes the first target 54 in the presence of oxygen delivered by the oxygen conduit 58, the first target produces an oxide of the first target material in the spatially distributed plume 14 (see FIGS. 1 and 2) of first coating material. This plume of coating material is directed toward the tool 12 containing the substrates to be coated. Similarly, when the material source 52 is moved so that the second target 56 is placed in position to be impinged by the ion beam from the ion beam gun 50, the second target produces an oxide of the second target material in a second spatially distributed plume of second coating material directed toward the tool 12.

As will be apparent to those skilled in the art after reading the present description, third and fourth deposition coating material targets (not shown) may be placed on the reverse side of the material source 52. The mounting mechanism for the material source 52 may be rotatable so that all targets on the material source 52 may be selectively and separately placed in the path of the ion beam generated by the ion beam generator 50.

Figures 4A, 4B:
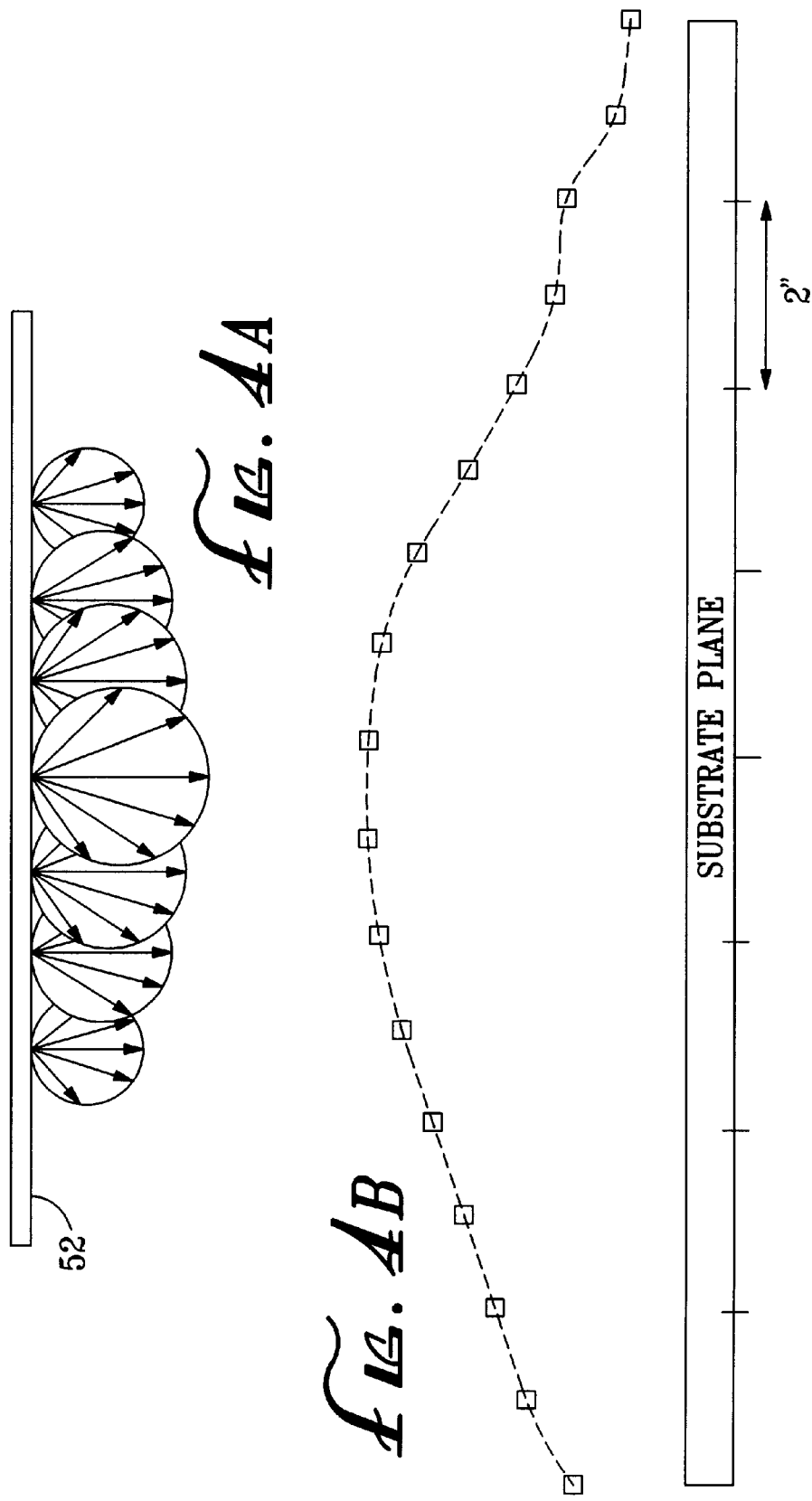
FIG. 4A is a stylistic representation of the production of coating material in a deposition process.
FIG. 4B is a stylistic representation of the spatial distribution of a coating material.

As illustrated conceptually in FIG. 4A, when the ion beam strikes the target material, the target produces a plurality of "beamlets" of the target material. Because the ion beam impacts the target material an angle, these beamlets typically form a plume that is not evenly distributed when it reaches the plane of the substrates 10 that are mounted on the tool 12. Thus, the profile of the plume, when it reaches the plane of the substrates 10 may be non-uniform, and non-symmetrical, as shown conceptually in FIG. 4B.

When a particular target, such as the target 54, 56 is used over a period of time, the surface of the target oxidizes to form the coating material that forms the plume to be deposited on the substrate. This oxidation process leaves the surface of the target uneven. As the surface of each target 54, 56 changes, the shape of the plume 14 (FIGS. 1 and 2) that flows toward the tool 12 is likely to change. To minimize the change in the plume shape, it may be advantageous to direct the ion beam from the ion beam gun 50 so that the beam does not continuously impinge the exact same point on the target 52, 54. This may be accomplished by randomly changing the position of the target 52 or 54 relative to the beam of the ion gun 50. This may be referred to as dithering the target. The output of a random number generator may be used to successively determine different positions in which to place the target relative to the ion beam gun 50. In practice, it may be found that movement of the target should be limited to one axis. Because the target tends to be quite heavy, it is often expensive and difficult to provide movement in two axes within the vacuum deposition chamber 30. This movement may be undertaken in the same axis as the movement to change the material source from the first target 54 to the second target 56.

A shutter 58 may be included in the vacuum deposition chamber 30. The shutter 58 may be selectively placed between the material source 52 and the tool 12 to shut off the flow of coating material to the tool 12. The shutter is typically a large piece of solid material such as a thick sheet of aluminum. The shutter may be selectively rotated into position in front of the tool 12. The rotation may be accomplished by means of the electric motor (not shown). Pneumatic control may be used for the movement of the shutter. Again, such a shutter arrangement will be understood by those skilled in the art. Using such a shutter allows the careful and accurate timing of the beginning and the end of the deposition process.

Figure 5:
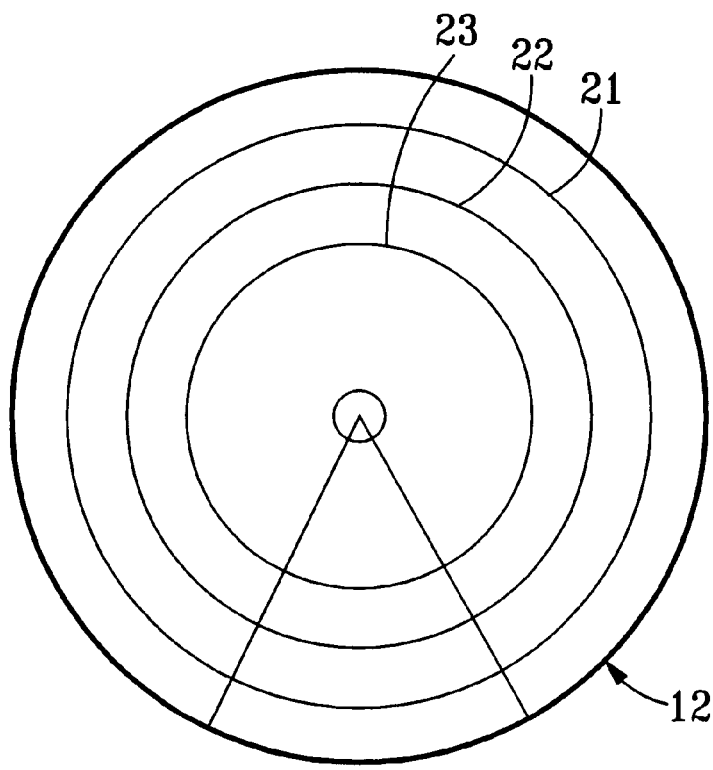
FIG. 5 is a planar schematic view of a tool used in a coating deposition process for mirrors.
Figure 6:
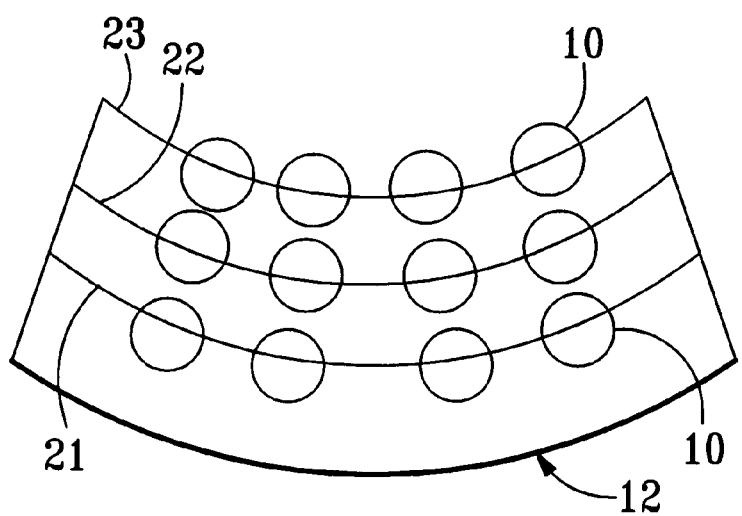
FIG. 6 is an enlarged view of a portion of the tool shown in FIG. 5, illustrating some of the mirror substrates.

Referring to FIG. 5, a particular embodiment of the tool 12 for receiving the mirror substrates 10 is shown. Of course, the illustrated embodiment is exemplary only. Other arrangements of the substrates 10 on the tool 12 may be used. In this particular embodiment, three concentric rings of mirror substrates 21, 22, 23 are illustrated stylistically. A detail of a segment of the tool 12, showing the individual mirror substrates 10, is shown in FIG. 6. Because the plume 14 of coating material has an uneven distribution, the substrates on the inner ring 23 may receive a different thickness of coating than do the substrates on the outer ring 21.

As is known in the art, a shadow mask, such as the shadow mask 16 (see FIGS. 1 and 2) may be placed before the tool 12 (in the path of the plume 14 of coating material) to compensate for the non-uniform shape of the plume of coating material. The objective of a mask such as the mask 16 is to cause the coating material to be evenly deposited on all the substrates 10 mounted on the tool 12.

The present inventors have found that different deposition coating materials produce plumes of different shapes. In particular, the present inventors have discovered that the shape of the plume 14 produced by the first target 54 differs from the plume of the second target 56. Therefore, a mask shaped to properly compensate for the plume shape of the first target 54 may not properly compensate for the (different) plume shape of the coating material from the second target 56. In fact, a mask shaped to properly compensate for the plume shape of the first target 54 may render the coating thickness of the second coating material less consistent.

In many applications, it has been sufficient to develop a mask that provides a compromise between the deposition patterns of multiple deposition materials. However, the present inventors have found that in certain applications, the variation in the thickness of the optical coatings must be less than 0.2 percent of the total coating thickness. One application requiring such highly accurate coating thickness is the optical coatings for the mirrors used in ZeroLock Gyros. For such low-tolerance coating thickness, a compromise mask has not provided adequate uniformity for all layers. Although the overall average coating thickness appears to be within tolerances using a single compromise mask for multiple coating materials, specific measurements of the individual coating layers on individual mirror substrates reveal substantial thickness variations.

Figure 7:
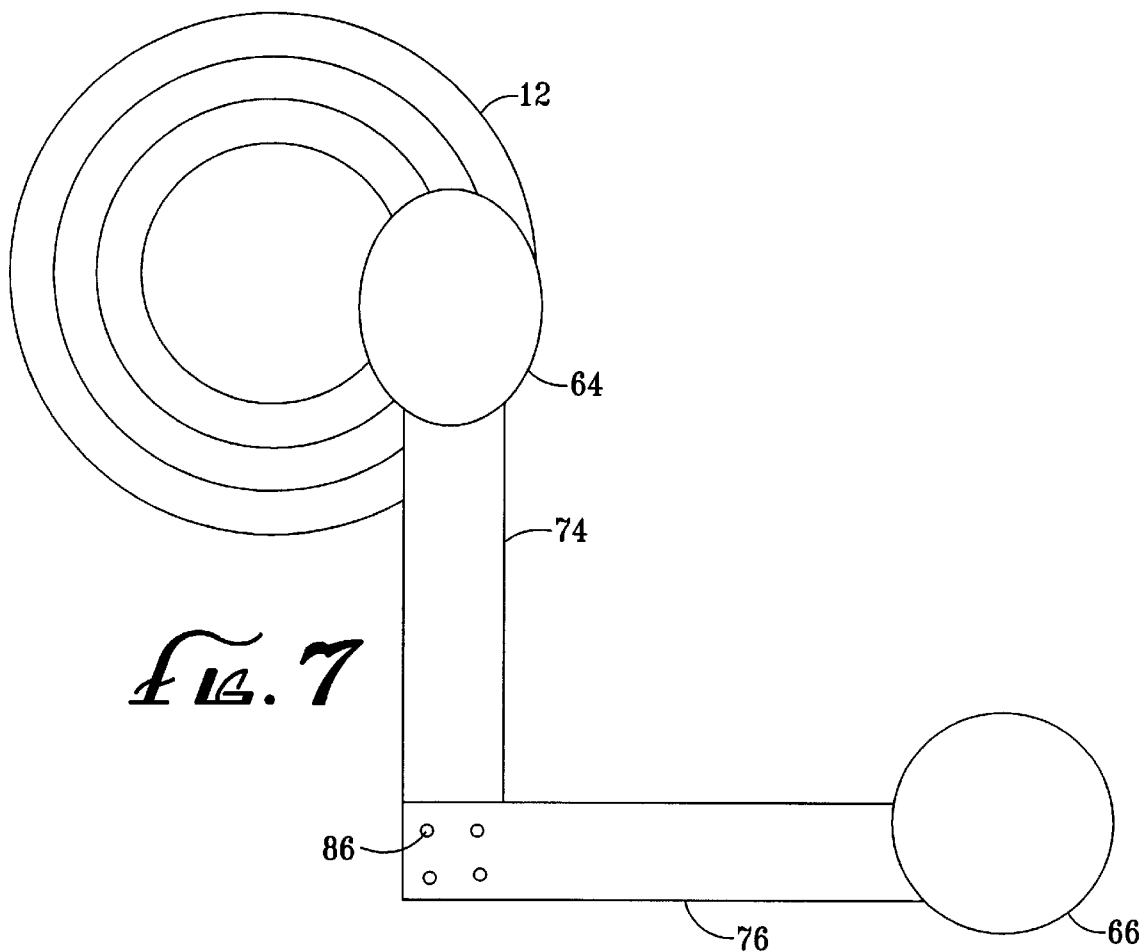
FIG. 7 is a view of a portion of the vacuum deposition chamber showing the substrate tool and shadow masks in accordance with an aspect of the present invention, taken along line 7—7 of FIG. 9.

In accordance with the present invention, the mask is changed for the deposition of different coating materials. Thus, a changeable mask configuration 62 is included in the vacuum chamber 30. In the illustrated embodiment, the mask configuration 62 includes a separate mask 64, 66 (see FIG. 7) for each target 54, 56. Each mask 64, 66 may be selectively placed between the material source 52 and the tool 12. Each mask is specifically shaped to compensate for the shape of the plume of a particular one of the target materials 54, 56. For example, referring to FIG. 7, the first shadow mask 64 is shaped in accordance with the requirements of the plume 14 from the first target material 54. The second shadow mask 66 is shaped in accordance with the shape of the plume 14 from the second target material 56. The shapes shown in FIG. 7 are for illustration only, and do not represent actual mask shapes. Those skilled in the art will understand the process of preparing a mask of the appropriate shape for a specific target.

When the ion beam from the ion beam gun 50 is impinging the first target material 54, the first mask 64 may be placed between the material source 52 and the tool 12. When the first mask 64 is properly shaped for the first target 54, the coating of first material across the substrates 10 on the tool is uniform.

When the ion beam from the ion beam gun 50 is impinging the second target material 56, the mask is changed so that it is appropriate for the plume shape emanating from the second target 56. In the particular embodiment illustrated, the mask is changed by removing the first mask 64 from its position before the tool 12, and placing the second mask 66 in position between the material source 52 and the tool 12. When the first second mask 66 is properly shaped for the second target material 56, the coating of the second material on each of the substrates 10 on the tool 12 is uniform.

Referring to FIG. 7, the first mask 64 is formed at the distal end of a first support 74. The second mask 66 is formed at the distal end of a second support 76. The near ends of those supports 74, 76 are securely affixed to provide a predetermined angle between the supports 74, 76. Although a 90 degree angle between the supports 74, 76 is illustrated in FIG. 7, those skilled the art will recognize that other angles may also be used.

Figure 8:
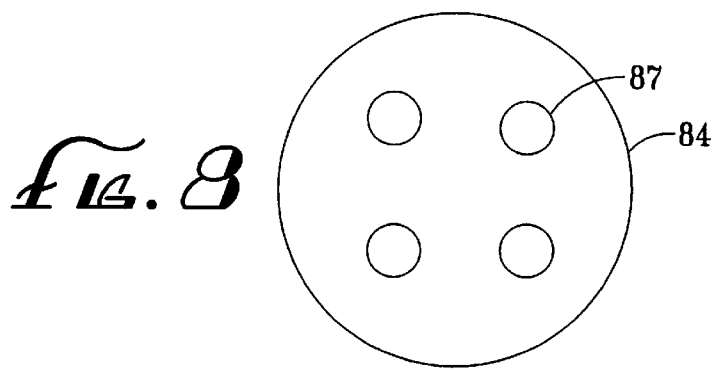
FIG. 8 is a view of a portion of the mask mounting structure comprising an aspect of the present invention.

The near ends of the supports 74, 76 are attached to a mask mounting base 84. The supports 74, 76 may be attached to the mounting base 84 using screws 86 that fit through openings drilled in the near ends of the supports 74, 76. The surface of the mounting base is provided with openings 87 to receive the ends of the screws 86 that attach the supports 74, 76 to the mounting base 84 (see FIG. 8). The openings 87 are threaded to engage the threaded screws 86. The attachment of the supports 74, 76 to the mounting base is such that the positions of the supports 74, 76 (and thus the masks 64, 66) relative to each other, and relative to the position of the mounting base 86 are maintained very exactly. Thus, the screws 86 and the openings 87 in the mounting base should be machined to a very high degree of accuracy.

The mounting base 84 may be rotated to selectively move the first mask 64 in position or the second mask 66 in position in front of the tool 12. The rotator includes position indexing so that the first and second masks may be accurately and repeatedly positioned properly relative to the tool.

In addition, in many applications, it may be desirable for the mounting base 84 to be able to rotate further to a position in which neither of the masks 64, 66 is between the material source 52 and tool 12. In addition, those skilled in the art will recognize that when more than two material targets are used, more than two masks such as the masks 64, 66 may be attached to the mounting base 84.

Figure 9:
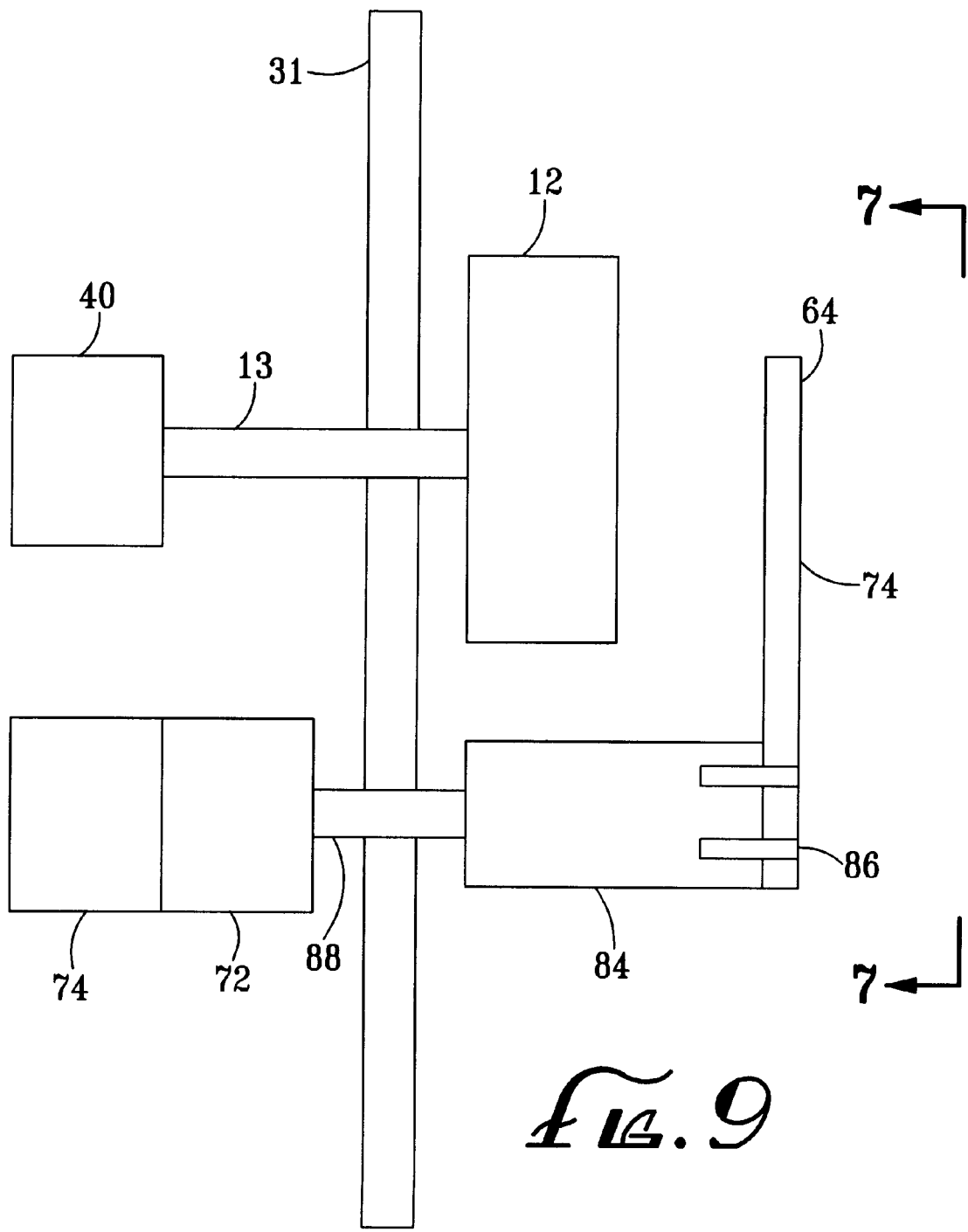
FIG. 9 is another view of a portion of the vacuum deposition chamber, taken along line 9—9 of FIG. 3.

Referring to FIG. 9, a side view of the tool and the mask mounting structure is shown. The mounting base 84 may be rotated by a rotating actuator. A pneumatic rotator 72 connected to the mounting base 84 through a shaft 88 may be used to rotate the mounting base 84. The pneumatic rotator preferably has hard stops that provide accurate and repeatable angular positions for the mounting base 84. Such accurate positioning of the mounting base 84 in turn provides accurate positioning of the masks 64, 66. Accurate and repeatable mask positioning is important, so that the best use is made of the specifically shaped masks 64, 66. An exemplary pneumatic rotator with hard stops may be a model MSQB20A rotator by SMC Pneumatics. Such a rotator provides two angular positions for the shaft 88 (and thus the mounting base 84).

Additional rotators may be positioned together co-axially on the shaft 88 to provide additional rotation positions for the mounting base 84. In the particular embodiment illustrated, two rotators 72, 74 are positioned in line to provide three positions of rotation for the mounting base 84. Those positions may be: 1) first mask 64 in position; 2) second mask 66 in position; and 3) no mask in position. For example, the first hard stop of the first rotator 72 may place the mounting base 84 in position so that the first mask 64 is positioned between the material source 52 and the tool 12. The second hard stop of the first rotator 72 may place the mounting base 84 in a position so that the second mask 64 is positioned between the material source 52 and the tool 12. Pneumatic pressure is used to move the rotator 72 between its first hard stop and its second hard stop. The first hard stop of the second rotator 74 may be set to coincide with the second hard stop of the first rotator 72. Similarly, pneumatic pressure is used to move the second rotator 74 between its first and second hard stop positions.

With one hard stop on each actuator 72, 74 set to a common rotational position of the mounting base 84, coordination is achieved between the two rotators 72, 74. Such coordination insures that the positions determined by the two rotators remain consistent and accurate relative one another. The second hard stop of the second rotator 74 may be set to provide a third rotational position for the mounting base 84. In this third rotational position for the mounting base, it may be in position so that neither the first mask 64 nor the second mask 66 is in position between the mounting material source 52 and tool 12. Those familiar with the art will recognize that if a third target material is used on the material source 52 (FIG. 3), the third position for the mounting base 84 may be used to place between the material source 52 and the tool 12 a third mask that compensates for the plume shape of the material produced by the third target. In addition, those familiar with the art will recognize that additional rotators such as the rotators 72, 74 may be added to provide additional rotational positions for the mounting base 84. As noted above, it may be found in certain applications that a 90 degree angle between the tool support members 74, 76 may not be necessary. An angle of less than 90 degrees may provide sufficient separation between the masks 64, 66. It will be apparent that with an angle of less than 90 degrees, more than three or four masks may be attached to the mounting base 84.

The process of depositing multiple coating layers will now be described in the context of an exemplary process for depositing to layers of coating material on a plurality of mirror substrates. The exemplary process may begin with the material source 52 comprising the targets 54, 56 positioned in the vacuum deposition chamber 30. The material source 52 is positioned so that the first target 54 is positioned in the path of the ion beam generated by the ion beam gun 50. The substrates 10 are mounted on the deposition tool 12. The deposition tool 12 is placed inside the deposition chamber 30. Deposition of the first layer of coating material from the first target 52 is begun by activating the ion beam gun 50. Advantageously, the shutter 58 is initially positioned in front of the deposition tool 12. The shutter 58 may be kept in front of the deposition tool 12 until a steady stream of coating material is developed. Once a steady stream of the first coating material is developed, the shutter 58 may be "opened" to expose the tool 12 to the plume of coating material. As noted above, the tool 12 may be rotated throughout the deposition process. The first mask 64 is positioned in front of the tool 12. As also noted above, the first mask 64 has been shaped to compensate for the shape of the plume of first coating material from the first target 54.

After the appropriate amount of the first coating material has been deposited on the substrates that are mounted on the tool 12, the shutter 58 is closed (positioned in front of the tool). Closing the shutter 58 stops the stream of coating material from reaching the tool 12. The appropriate time for closing the shutter may be determined based on the duration of deposition at a known deposition rate.

With the shutter in place, the material source 52 may be moved, to remove the first target 54 from the path of the ion beam, and place the second target 56 in the path of the ion beam from the ion been gun 50. In certain applications, the ion beam gun 50 should be turned off during this time, while in others, the gun may remain on.

Once the second target 56 is in place, and a steady stream of coating material is being generated from it, the shutter may again be opened so that the second coating material may be deposited upon substrates mounted on tool 12. Again, the rate of deposition is known, so the elapsed time may be measured to determine when an adequate coating of the second material has been deposited. At that time, the shutter 58 may again be closed to stop the deposition process.

Based on the teaching provided above, it will also be apparent that other configurations may be used in lieu of removing one mask 64 and replacing it with another mask 66. For example, the first and second masks may be attached to separate mounting bases. Then different mask shapes may be obtained by a selectively positioning the different masks in various combinations. For example, a first mask may be positioned between the material source 52 and the tool 12 while a first material is being deposited. Then a second mask may be positioned between the material source 52 and the tool 12 without removing the first mask, thus producing a combined mask for deposition of the second material. Those skilled in the art will recognize that other configurations of combining and replacing masks may be used to meet individual requirements for mask shapes.

Also included in the vacuum deposition chamber 30 (see FIG. 3) may be aluminum shields 90, and a silicon dioxide shield 92. Such shields are common in the coating deposition art, and are understood by those skilled in that art. An additional element that may commonly be included in the vacuum deposition chamber 30 is an RF neutralizer 94.

Although the invention has been described in connection with a preferred embodiment directed towards the manufacture of mirrors for use in ring laser gyroscopes, it will be understood that the invention is also applicable to other material deposition processes. For example, the present invention may also have applicability in processes for applying coatings to eyeglass lenses, applying coatings to razor blades, and other applications in which successive layers of coating materials are to be applied in such manner as to produce extremely uniform coatings layers.

Furthermore, those skilled in the art will recognize that various modifications to the specific embodiment described above may be made without departing from the spirit of the invention, and all remaining within the scope of the following claims.

We claim:

1. A method of depositing successive layers of first and second coating materials onto a substrate, the method comprising:

placing the substrate in a vacuum chamber having a source of the first coating material and the second coating material;

placing a first shadow mask between the substrate and the coating material source, wherein the first shadow mask is spaced from the substrate, and is shaped to compensate for nonuniformities in a flow of the first coating material;

directing a flow of the first coating material from the coating material source toward the mask and the substrate so that the first coating material forms a substantially uniformly thick first layer on the substrate;

placing a second shadow mask between the substrate and the coating material source, wherein the second shadow mask is spaced from the substrate, and is shaped to compensate for nonuniformities in a flow of the second coating material directing a flow of the second coating material from the coating material source toward the substrate so that the second coating material forms a substantially uniformly thick second layer on the first layer of first coating material.

2. The method of claim 1, wherein the step of placing the second shadow mask comprises:

removing the first mask from between the substrate and the coating material source; and placing the second mask between the substrate and the coating material source.

3. A method of manufacturing mirrors for use in a ring laser gyroscope, the method comprising:

placing in a vacuum deposition chamber a first target formed of a first coating material, and a second target formed of a second coating material;

placing a mirror substrate in a vacuum deposition chamber;

placing between the mirror substrate and the first target, and spaced from the mirror substrate, a first shadow mask;

generating from the first target a first plume of the first coating material, and directing the first plume toward the mask and the mirror substrate;

wherein the first mask has a first predetermined shape such that when the plume of first coating material is directed toward the first mask and the substrate, the first coating material is deposited to a substantially uniform thickness on the substrate; and placing between the mirror substrate and the second target, and spaced from the minor substrate, a second shadow mask; and generating from the second target a second plume of the second coating material, and directing the second plume toward the mask and the mirror substrate;

wherein the second mask has a second predetermined shape such that when the plume of second coating material is directed toward the second mask and the substrate, the second coating material is deposited to a substantially uniform thickness on the first coating.

4. The method of claim 3, wherein:

the step of generating the first plume comprises directing an ion beam toward the first target; and the step of generating the second plume comprises directing an ion beam toward the second target.

* * * * *